United States Patent [19]

Aoai et al.

[11] Patent Number: 4,898,803
[45] Date of Patent: Feb. 6, 1990

[54] LIGHT-SENSITIVE O-QUINONE DIAZIDE COMPOSITION WITH ACIDIC POLYURETHANE RESIN

[75] Inventors: Toshiaki Aoai; Keitaro Aoshima; Akira Nagashima, all of Shizuoka, Japan

[73] Assignee: Fuji Photo Film Co., Ltd., Minami-Ashigara, Japan

[21] Appl. No.: 119,578

[22] Filed: Nov. 12, 1987

[30] Foreign Application Priority Data

Nov. 14, 1986 [JP] Japan ................... 61-271554

[51] Int. Cl.$^4$ ................... G03C 1/60; G03C 1/54; G03C 1/495
[52] U.S. Cl. ................... 430/191; 430/166; 430/167; 430/190; 430/192; 430/193; 430/270; 430/302; 430/326
[58] Field of Search ................... 430/192, 193, 175, 176, 430/190, 191, 166, 167

[56] References Cited

U.S. PATENT DOCUMENTS

| | | | |
|---|---|---|---|
| 2,770,612 | 11/1956 | Schollenberger et al. | 525/440 |
| 2,871,218 | 1/1959 | Schollenberger et al. | 528/272 |
| 3,660,097 | 5/1972 | Mainthia | 430/192 |
| 4,289,838 | 9/1981 | Rowe et al. | 430/192 |
| 4,442,195 | 4/1984 | Yamamoto et al. | 430/192 |
| 4,467,027 | 8/1984 | Yamamoto et al. | 430/175 |
| 4,678,737 | 7/1987 | Schneller et al. | 430/192 |
| 4,752,552 | 6/1988 | Aoai | 430/270 |

FOREIGN PATENT DOCUMENTS

| | | | |
|---|---|---|---|
| 61-20939 | 1/1986 | Japan . | |
| 2185120 | 7/1987 | United Kingdom | 430/175 |

*Primary Examiner*—Charles L. Bowers, Jr.
*Attorney, Agent, or Firm*—Burns, Doane, Swecker & Mathis

[57] ABSTRACT

A light-sensitive composition comprises at least one polyurethane resin having repeating unit represented by formula (I) and/or repeating unit represented by formula (II) and which is insoluble in water and soluble in aqueous alkaline solution; and at least one positive-working light-sensitive compound:

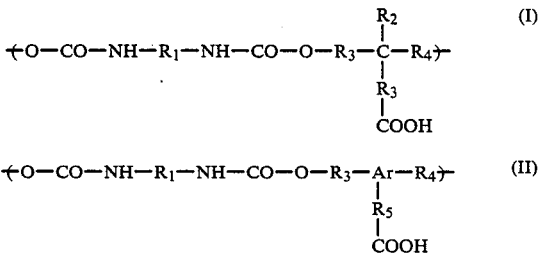

wherein $R_1$ represents a bivalent aliphatic or aromatic hydrocarbon which may have a substituent; $R_2$ represents hydrogen atom or an alkyl, an aralkyl, an aryl, an alkoxy or an aryloxy group which may be substituted with a substituent; $R_3$, $R_4$ and $R_5$ may be the same or different and independently represent a single bond or a bivalent aliphatic or aromatic hydrocarbon group which may have a substituent and Ar represents a trivalent aromatic hydrocarbon group which may have a substituent. The composition has good coating properties and makes it possible to impart excellent wear resistance and printing durability to the resultant light-sensitive products such as PS plates, print-circuit boards, photomasks and the like.

14 Claims, No Drawings

LIGHT-SENSITIVE O-QUINONE DIAZIDE COMPOSITION WITH ACIDIC POLYURETHANE RESIN

BACKGROUND OF THE INVENTION

1. Field of the Invention

The present invention relates to a light-sensitive composition suitable for producing presensitized plates for use in making lithographic printing plates, print-circuit boards for IC or photomasks and more particularly to a light-sensitive composition which comprises a positive-working light-sensitive compound and a polymeric compound excellent in wear resistance.

2. Description of the Prior Art

Light-sensitive compositions comprising an o-quinonediazide compound and a novolak type phenolic resin have industrially been employed to produce a presensitized plate for use in making lithographic printing plates (hereunder referred to as "PS plate(s)" for simplicity) or as a photoresist because of very excellent properties thereof.

However, the novolak type phenol resins used as a principal ingredient for such a light-sensitive composition suffer from various kinds of disadvantages to be eliminated, such as low adherence to a substrate used, formation of a fragile film, low coating performance, low wear resistance and insufficient printing durability of the resulting lithographic printing plates when they are used for manufacturing PS plates. Therefore, the application thereof is restricted to a narrow range.

In order to solve the foregoing problems, it has been proposed to use a variety of polymeric compounds as a binder. For example, Japanese Patent Publication for Opposition Purpose (hereinafter referred to as "J. P. KOKOKU") No. 52-41050 discloses the use of polyhydroxystyrene or hydroxystyrene copolymer as such a binder. These polymers surely permit the improvement of coating performance of the resulting light-sensitive composition while the problem with respect to wear resistance thereof still remains unsolved. In addition, Japanese Patent Un-Examined Published Application (hereinafter referred to as "J. P. KOKAI") No. 51-34711 proposes the use of a polymeric compound having structural units of an acrylic acid derivative within the molecular structure thereof as a binder. However, the use of such a polymeric compound largely restricts the range of proper developing conditions and provides insufficient wear resistance.

On the other hand, polyurethane resins have been known as a polymer excellent in wear resistance and, for instance, J. P. KOKOKU No. 49-36961 discloses a light-sensitive composition which comprises a combination of a positive-working diazonium compound and a substantially linear polyurethane resin. However, the polyurethane resin does not include alkali-soluble groups and thus is essentially less soluble in an aqueous alkaline developer. This makes the development difficult and a part of the film to be removed remains undissolved.

Furthermore, J. P. KOKAI No. 61-20939 discloses a light-sensitive composition in which an anionic polyurethane resin is incorporated. However, the anionic polyurethane resin is water-soluble and, therefore, it has insufficient solubility in an organic solvent used for preparing a coating liquid. Moreover, the resin is not preferred since it impairs the stability of the diazo compounds.

SUMMARY OF THE INVENTION

As seen from the foregoing discussions, there still remains room for improving properties of light-sensitive compositions in order to provide a novel light-sensitive composition which satisfies various practical requirements.

Accordingly, it is an object of the present invention to provide a light-sensitive composition which contains, as a binder, a polymeric compound capable of imparting excellent wear resistance to the composition which can be developed with an aqueous alkaline developer and which makes it possible to manufacture a PS plate or more specifically a lithographic printing plate of high printing durability.

It is another object of the present invention to provide a light-sensitive composition having high adherence to a substrate and good solubility in an organic solvent used for preparing a coating liquid as well as capable of providing a flexible film.

The inventors of the present invention have conducted various studies to accomplish the foregoing objects and found that these objects can effectively be attained by providing a light-sensitive composition comprising a specific combination of ingredients and thus completed the present invention.

According to the present invention, a novel light-sensitive composition is provided, which comprises a polyurethane resin having repeating unit represented by formula (I) and/or repeating unit represented by formula (II) and which is insoluble in water and soluble in aqueous alkaline solution; and a positive-working light-sensitive compound:

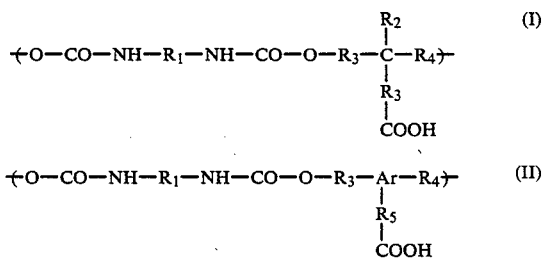

wherein $R_1$ represents a bivalent aliphatic or aromatic hydrocarbon group which may have a substituent (preferred examples thereof including, an alkyl, an aralkyl, an aryl or an alkoxy group or a halogen atom), $R_1$ may optionally have other functional groups which do not undergo a reaction with isocyanate groups, such as an ester, an urethane, an amido or an ureido group; $R_2$ represents hydrogen atom or an alkyl, an aralkyl, an aryl, an alkoxy or an aryloxy group which may be substituted with a substituent such as cyano, nitro, a halogen atom (—F, —Cl, —Br, —I), —CONH$_2$, —COOR$_6$, —OR$_6$, —NHCONHR$_6$, —NHCOOR$_6$, —NHCOR$_6$, —OCONHR$_6$, —CONHR$_6$ (wherein R$_6$ represents an alkyl group having 1 to 10 carbon atoms or an aralkyl group having 7 to 15 carbon atoms); $R_3$, $R_4$ and $R_5$ may be the same or different and independently represent a single bond or a bivalent aliphatic or aromatic hydrocarbon group optionally having a substituent (preferred examples thereof being an alkyl, an aralkyl, an aryl or an alkoxy group or a halogen atom), $R_3$, $R_4$ and $R_5$ may have other functional groups which do not react with isocyanate groups, such as an ester, an urethane, an amido, an ureido or an ether group and at least two of $R_3$, $R_4$ and $R_5$ may form a ring together; and Ar represents a trivalent aromatic hydrocarbon group optionally having a substituent.

DETAILED EXPLANATION OF THE INVENTION

The light-sensitive composition of the present invention will hereunder be explained in more detail.

(1) Polyurethane Resins

The polyurethane resins conveniently used herein are those having carboxyl groups, which are insoluble in water and soluble in an aqueous alkaline solution and preferred is one having, as a base skeleton, the reaction product of a diisocyanate compound of the following general formula (III) with a diol compound having carboxyl group and represented by the general formula (IV) or (V):

$$\text{OCN}-R_1-\text{NCO} \quad (\text{III})$$

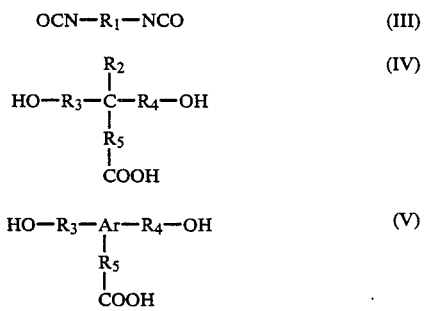

wherein $R_1$ to $R_5$ and Ar are the same as those defined above in connection with the general formulas (I) and (II).

Preferred polyurethane resins and the reaction products are, for instance, those having the repeating units of the general formulas (I) or (II) wherein $R_1$ is the same as defined above and preferably alkylene group having 2 to 15 carbon atoms and an aryl group having 6 to 20 carbon atoms; $R_2$ represents hydrogen atom, an alkyl group having 1 to 8 carbon atoms or an aryl group having 6 to 15 carbon atoms; $R_3$, $R_4$ and $R_5$ may be the same or different and independently represent an alkylene group having 1 to 20 carbon atoms, an arylene group having 6 to 15 carbon atoms and more particularly an alkylene group having 1 to 8 carbon atoms; and Ar represents an aromatic group having 6 to 15 carbon atoms.

Examples of diisocyanates represented by the general formula (III) include aromatic diisocyanate compounds such as 2,4-tolylenediisocyanate, dimer of 2,4-tolylenediisocyanate, 2,6-tolylenediisocyanate, p-xylylenediisocyanate, m-xylylenediisocyanate, 4,4'-diphenylmethanediisocyanate, 1,5-naphthylenediisocyanate,3,3'-dimethylbiphenyl-4,4'-diisocyanate; aliphatic diisocyanate compounds such as hexamethylenediisocyanate, trimethylhexamethylenediisocyanate, lysin diisocyanate and diisocyanates of dimeric acids; alicyclic diisocyanates such as isophorone diisocyanate, 4,4'-methylene-bis(cyclohexylisocyanate), methylcyclohexane-2,4(or 2,6)-diisocyanate, 1,3-(isocyanatomethyl)-cyclohexane; and reaction product of a diol with a diisocyanate such as an adduct obtained from 1,3-butylene glycol and tolylenediisocyanate (1:2 molar ratio).

Specific examples of the diol compounds which have carboxyl groups and are represented by the general formula (IV) or (V) include 3,5-dihydroxybenzoic acid, 2,2-bis(hydroxymethyl)-propionic acid, 2,2-bis(2-hydroxyethyl)-propionic acid, 2,2-bis(3-hydroxypropyl)-propionic acid, bis(hydroxymethyl)-acetic acid, bis(4-hydroxyphenyl)-acetic acid, 4,4-bis(4-hydroxyphenyl)-pentanoic acid and tartaric acid.

The polyurethane resin as used herein may also be obtained from diisocyanate compound of the formula (III) and two or more of the diol compounds having carboxyl groups and represented by the general formula (IV) or (V).

Moreover, it is also possible to simultaneously use a diol compound which has no carboxyl group and does not react with isocyanate group in such an amount that the alkali developing properties of the resultant light-sensitive composition is not impaired at all.

Examples of such diol compounds include ethylene glycol, diethylene glycol, triethylene glycol, tetraethylene glycol, propylene glycol, dipropylene glycol, polyethylene glycol, polypropylene glycol, neo-pentyl glycol, 1,3-butylene glycol, 1,6-hexanediol, 2-butene-1,4-diol, 2,2,4-trimethyl-1,3-pentanediol, 1,4-bis-beta-hydroxyethoxycyclohexane, cyclohexanedimethanol, tricyclodecanedimethanol, hydrogenated bisphenol A, Hydrogenated bisphenol F, ethyleneoxide adduct of bisphenol A, propyleneoxide adduct of bisphenol A, ethyleneoxide adduct of bisphenol F, propyleneoxide adduct of bisphenol F, ethyleneoxide adduct of hydrogenated bisphenol A, propyleneoxide adduct of hydrogenated bisphenol A, hydroquinone dihydroxyethyl ether, p-xylylene glycol, dihydroxyethyl sulfone, bis(2-hydroxyethyl)-2,4-tolylenedicarbamate, 2,4-tolylenebis(2-hydroxyethylcarbamide), bis(2-hydroxyethyl)-m-xylylenedicarbamate, bis(2-hydroxyethyl)-isophthalate,

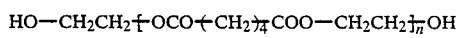

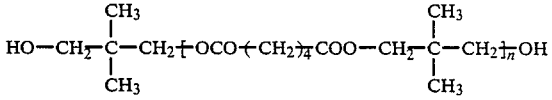

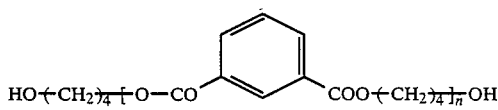

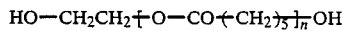

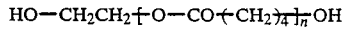

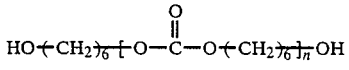

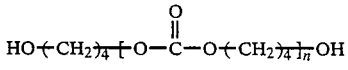

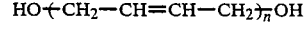

-continued

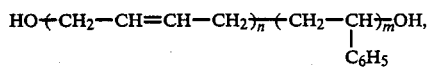

and

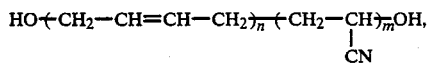

wherein m and n are integers of two or more, respectively.

The foregoing polyurethane resins as used herein are prepared by heating the aforementioned diisocyanate compound and diol compound in an aprotic solvent in the presence of an active known catalyst depending upon the activity of these compounds. The molar ratio between these diisocyanate and diol compounds preferably ranges from 0.8:1 to 1.2:1. In this connection, if the isocyanate group at the terminal of the resultant polymer remains unreacted, such an isocyanate group can be eliminated by treating the polymer with an alcohol or an amine to finally obtain polymers having no residual isocyanate group.

The polyurethane resins used in the present invention have preferably an acid value (carboxyl content) of at least 0.5 meq/g, particularly 1.5 to 4.0 meq/g.

It is desirable that the molecular weight of the polyurethane resin used in the present invention be preferably not less than 1,000 (weight average) and particularly preferred molecular weight thereof is in the range of from 5,000 to 100,000.

These polyurethane resins may be used alone or in combination. The amount of the polyurethane resin in the light-sensitive composition falls within the range of from about 5 to 90% by weight of the composition, preferably from about 10 to 60% by weight.

(2) Positive-working Light-sensitive Compounds

On the other hand, examples of the positive-working light-sensitive compounds as used herein include o-quinonediazide compounds. Most preferred o-quinonediazide compounds used in this invention include an ester of 1,2-diazonaphthoquinone sulfonic acid chloride with pyrogallolacetone resin disclosed in J. P. KOKOKU No. 43-28403. Other preferred o-quinonediazide compound includes, for instance, an ester 1,2-diazonaphthoquinone sulfonic acid chloride and phenol-formaldehyde resin described in U.S. Pat. Nos. 3,046,120 and 3,188,210. Other useful o-quinonediazide compounds have also been known and reported in a variety of patents, for instance, J. P. KOKAI Nos. 47-5303, 48-63802, 48-63803, 48-96575, 49-38701 and 48-13354; J. P. KOKOKU Nos. 41-11222, 45-9610 and 49-17481; U.S. Pat. Nos. 2,797,213; 3,454,400; 3,544,323; 3,573,917; 3,674,495 and 3,785,825; U.K. Pat. Nos. 1,227,602; 1,251,345; 1,267,005; 1,329,888 and 1,330,932; and German Pat. No. 854,890.

Positive-working light-sensitive compounds other than o-quinonediazide compounds may also be used in the light-sensitive composition of the present invention and examples thereof include polymeric compounds having o-nitrocarbinol ester residues disclosed in J. P. KOKOKU No. 56-2696.

Moreover, it is also possible, in the present invention, to use a combination of a compound which generates an acid due to photolysis and a compound having C—O—C or C—O—Si groups which can dissociate in the presence of an acid.

As examples of such combinations, there may be mentioned those of a compound capable of generating an acid due to the action of light with acetal or O,N-acetal compound disclosed in J. P. KOKAI No. 48-89003; with an orthoester or an amido acetal compound disclosed in J. P. KOKAI No. 51-120714; with a polymer having orthoester groups on the main chain thereof disclosed in J. P. KOKAI No. 53-133429; with an enol ether compound disclosed in J. P. KOKAI No. 55-12995; with an N-acyliminocarbonate compound disclosed in J. P. KOKAI No. 55-126236; with a polymer having orthoester groups on its main chain disclosed in J. P. KOKAI No. 56-17345; with a silyl ester compound disclosed in J. P. KOKAI No. 60-10247 and with a silyl ether compound disclosed in J. P. KOKAI Nos. 60-37549 and 60-121446.

The amount of these positive-working light-sensitive compounds (inclusive of the foregoing combinations) used in the light-sensitive composition according to the present invention is in the range of from 10 to 50% by weight of the composition and particularly preferred amount thereof falls within the range of from 20 to 40% by weight.

(3) Other Components of the Composition

The light-sensitive composition of the present invention may further include known alkali-soluble polymeric compounds such as phenol-formaldehyde resin, cresol-formaldehyde resin, phenolic modified xylene resin, polyhydroxystyrene and halogenated polyhydroxystyrene in addition to the aforementioned polyurethane resins. These alkali-soluble polymeric compounds are used in an amount of not more than 70% by weight of the total weight of the composition.

The composition of the present invention may include a cyclic acid anhydride for enhancing the sensitivity thereof, an agent or composition for obtaining a visible image immediately after exposure to light, a dye serving as an image-coloring agent or other fillers. Examples of the cyclic acid anhydrides include phthalic acid anhydride, tetrahydrophthalic acid anhydride, hexahydrophthalic acid anhydride, 3,6-endoxy-Δ-tetrahydrophthalic acid anhydride, tetrachlorophthalic acid anhydride, maleic anhydride, chloromaleic acid anhydride, alpha-phenylmaleic acid anhydride, succinic anhydride and pyromellitic anhydride. If such a cyclic acid anhydride is added to the light-sensitive composition of the present invention in an amount of from 1 to 15% by weight thereof, the sensitivity of the composition can be increased 3 times as large as that observed when such an acid anhydride is not added at all.

Typical examples of the agent or composition for obtaining a visible image immediately after exposure to light are combinations of light-sensitive compounds capable of generating an acid when exposed to light and organic dyes capable of forming salts therewith. For example, there may be mentioned such a combination as an o-naphthoquinonediazido-4-sulfonic acid halide and a salt-forming organic dye disclosed in J. P. KOKAI Nos. 50-36209 and 53-8128; and a trihalomethyl compound and a salt-forming organic dye disclosed in J. P. KOKAI Nos. 53-36223 and 54-74728.

As the image-coloring agents, the salt-forming organic dyes listed above in connection with the agent for obtaining a visible image immediately after exposure to light and other dyes may be used in the composition of the present invention. Preferred examples thereof are oil-soluble dyes and basic dyes, such as Oil Yellow #101, Oil Yellow #130, Oil Pink #312, Oil Green BG, Oil Blue BOS, Oil Blue #603, Oil Black BY, Oil Black BS, Oil Black T-505 (these being all manufactured and sold by ORIENT CHEMICAL INDUSTRIES LTD.); Victoria Pure Blue, Crystal Violet (CI 42555), Methyl Violet (CI 42535), Rhodamine B(CI 45170B), Malachite Green (CI 42000) and Methylene Blue (CI 52015).

The light-sensitive composition of the present invention is in general applied to the surface of a substrate in the form of a solution in a suitable solvent. Examples of solvents used include ethylenedichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, toluene and ethyl acetate and these solvents may be used alone or in combination. It is desirable that the concentration (solid content) of the light-sensitive composition be in the range of from 2 to 50% by weight. On the other hand, the coated amount thereof varies dependent upon applications. For instance, preferred amount thereof to be coated is 0.5 to 3.0 g/$m^2$ in the case of PS plates. As the coated amount thereof decreases, the sensitivity of the light-sensitive composition becomes high while physical properties of the resultant light-sensitive films are lowered.

When a PS plate is manufactured utilising the light-sensitive composition of the present invention, as a substrate, it is possible to used such a hydrophilized aluminum plate as silicate treated, anodized, grained and silicate electrodeposited aluminum plates as well as a zinc plate, a stainless steel plate, a chromium treated steel plate, hydrophilized plastic films, paper and the like.

The layer of the light-sensitive composition of the present invention can be developed preferably with a developer, for instance, an aqueous solution of an alkaline inorganic agent such as sodium silicate, potassium silicate, sodium hydroxide, potassium hydroxide, lithium hydroxide, sodium phosphate, disodium hydrogen phosphate, ammonium phosphate, diammonium hydrogen phosphate, sodium metasilicate, sodium bicarbonate and aqueous ammonia. The concentration of these alkaline inorganic agents in the aqueous solutions ranges from 0.1 to 10% by weight, preferably from 0.5 to 5% by weight.

In addition, such as aqueous alkaline solution may contain a surfactant and an organic solvent such as an alcohol according to need.

Light sources such as carbon arc lamp, mercury lamp, Xenon lamp, tungsten lamp and metal halide lamp can be used for exposing, to light, the light-sensitive composition of the present invention.

The light-sensitive composition according to the present invention is excellent in coating properties required when coating it on the surface of a substrate and has an improved developing properties with an aqueous alkaline developer required when developing it after being coated on a substrate, dried and imagewise exposed to light. The relief images thus obtained have high wear resistance and good adherence to the substrate and, therefore, makes it possible to provide large number of printed matters if the product is used as a lithographic printing plate.

The light-sensitive composition of the present invention will hereunder be described in more detail in accordance with the following preparation examples and non-limitative working examples and further the effects practically attained according to the present invention will also be discussed in comparison with comparative examples.

PREPARATION EXAMPLE 1

There were charged, into a three necked round flask of 500 ml volume provided with a condenser and an agitator, 125 g (0.05 moles) of 4,4'-diphenylmethanediisocyanate and 67 g (0.05 moles) of 2,2-bis(hydroxymethyl)propionic acid and these compounds were dissolved in 290 ml of dioxane. Then, 1 g of N,N-diethylaniline as a catalyst was added thereto and the resultant mixture was refluxed under heating for 6 hrs. with stirring. Thereafter, the reaction solution was poured into 4 liters of water and 40 ml of acetic acid while stirring to precipitate white polymer particles. The precipitates of the polymer was filtered off, washed with water and dried in vacuo to recover 185 g of the polymer (polyurethane (a) of the present invention).

The molecular weight of polyurethane (a) was estimated to be 28,000 (weight average molecular weight with reference to polystyrene as the standard) according to gel permeation chromatography (GPC). Moreover, the content of carboxyl groups thereof was also estimated to be 2.47 meq./g according to titration technique.

PREPARATION EXAMPLES 2 TO 14

Polyurethane resins having carboxyl groups were prepared as in Preparation Example 1 except that diisocyanates and diol compounds listed in Table I were used. Likewise, the molecular weight and the content of carboxyl group were determined according to GPC and titration technique respectively. The content of carboxyl group thus determined are summarized in Table I. On the other hand, the molecular weight of all the resultant polyurethane resins thus determined were in the range of from 8,000 to 45,000 expressed as the weight average molecular weight with respect to polystyrene as the standard.

TABLE I

| Polyurethane | Diisocyanate Compound (mole %) | Diol Compound (mole %) | —COOH content (meq/g) |
|---|---|---|---|
| (b) | OCN-(CH$_2$)$_6$-NCO (100) | 3,5-dihydroxybenzoic acid: HO—C$_6$H$_3$(OH)—COOH (100) | 2.95 |
| (c) | Isophorone diisocyanate (trimethyl cyclohexane with CH$_2$—NCO and NCO substituents) (100) | 4,4'-dihydroxydiphenyl-acetic acid: (HO—C$_6$H$_4$)$_2$CH—COOH (100) | 2.07 |
| (d) | m-xylylene diisocyanate: OCN—H$_2$C—C$_6$H$_4$—CH$_2$NCO (100) | 2,2-bis(hydroxymethyl)propionic acid: HO—CH$_2$—C(CH$_3$)(COOH)—CH$_2$—OH (100) | 2.97 |
| (e) | 2,4-tolylene diisocyanate (100) | HO—CH$_2$—C(CH$_3$)(COOH)—CH$_2$—OH (100) | 3.10 |
| (f) | 3,3'-dimethyl-4,4'-biphenylene diisocyanate (100) | HO—CH$_2$—C(CH$_3$)(COOH)—CH$_2$—OH (70) + HO—(CH$_2$CH$_2$—O)$_7$—H (30) | 1.71 |
| (g) | 1,5-naphthalene diisocyanate (50) + OCN-(CH$_2$)$_6$-NCO (50) | HO—CH$_2$—C(CH$_3$)(COOH)—CH$_2$—OH (100) | 2.97 |

TABLE I-continued

| Polyurethane | Diisocyanate Compound (mole %) | Diol Compound (mole %) | —COOH content (meq/g) |
|---|---|---|---|
| (h) | OCN—C₆H₃(CH₃)— N(CO)₂N —C₆H₃(CH₃)—NCO (50) + CH₃—C₆H₃(NCO)₂ and OCN—(CH₂)₆—NCO (50) | HO—CH₂—C(CH₃)(COOH)—CH₂—OH (70) + HO—CH₂—C(CH₃)₂—CH₂—OH (30) | 1.75 |
| (i) | OCN—C₆H₄—CH₂—C₆H₄—NCO (60) + OCN—(CH₂)₆—NCO (40) | HO—CH₂—C(CH₃)(COOH)—CH₂—OH (100) | 2.74 |
| (j) | OCN—C₆H₄—CH₂—C₆H₄—NCO (60) + OCN—(CH₂)₆—NCO (40) | HO—CH₂—C(CH₃)(COOH)—CH₂—OH (70) + HO—CH₂CH₂—SO₂—CH₂CH₂—OH (30) | 1.89 |
| (k) | OCN—C₆H₄—CH₂—C₆H₄—NCO (40) + isophorone diisocyanate (60) | 4,4'-bis(hydroxyphenyl)-COOH compound (60) + HO—(CH₂)₆—OH (40) | 1.31 |
| (l) | OCN—C₆H₄—CH₂—C₆H₄—NCO (70) + isophorone diisocyanate (30) | HO—CH₂—C(CH₃)(COOH)—CH₂—OH (100) | 2.52 |
| (m) | OCN—C₆H₄—CH₂—C₆H₄—NCO (60) + OCN—CH₂—C₆H₄—CH₂NCO (40) | 1,3-phenylene-bis(—COO—CH₂CH₂—OH) (30) + HO—CH₂—C(CH₃)(COOH)—CH₂—OH (70) | 1.62 |

TABLE I-continued

| Polyurethane | Diisocyanate Compound (mole %) | Diol Compound (mole %) | —COOH content (meq/g) |
|---|---|---|---|
| (n) | $H_3C$-[benzene]-[benzene]-$CH_3$ with OCN and NCO (60) + OCN—(CH$_2$)$_6$—NCO (40) | HO—CH$_2$—C(CH$_3$)(COOH)—CH$_2$—OH (100) | 2.67 |

EXAMPLES 1 TO 5

The surface of an aluminum plate of 0.30 mm in thickness was grained with a nylon brush and an aqueous suspension of pumice stone of 400 mesh and was washed with water sufficiently. The aluminum plate was etched by immersing it in 10% aqueous sodium hydroxide solution at 70° C. for 60 seconds, washed with running water, neutralized with 20% $HNO_3$ and then washed with water. The aluminum plate was then subjected to electrolytic surface roughening treatment in 1% aqueous solution of nitric acid under the conditions of $V_A=12.7$ V, 160 coulomb/$dm^2$ of electricity at the anode time, utilizing an alternating waved current of sign wave. The surface roughness of the plate thus treated was 0.6 microns (expressed as Ra). Subsequently, the plate was desmutted by immersing it into 30% aqueous solution of $H_2SO_4$ at 55° C. for 2 minutes and then was anodized at a current density of 2 A/$dm^2$ in 20% aqueous solution of $H_2SO_4$ so that the thickness thereof was reduced to 2.7 g/$m^2$.

Then, 5 light-sensitive liquids (A)-1 to (A)-5 were prepared by using a variety of polyurethane resins of the invention specified in Table II and the composition thereof were the same as that of the following light-sensitive liquid (A). These light-sensitive liquids were applied to the surface of the anodized aluminum plates and were dried at 100° C. for 2 minutes to obtain PS plates (A)-1 to (A)-5. In this connection the coated amount of these light-sensitive liquids was 2.5 g/$m^2$ (dry basis).

| Composition of the Light-sensitive Liquid (A) | |
|---|---|
| Component | Amount (g) |
| Esterified product of naphthoquinone-1,2-diazido-5-sulfonyl chloride and pyrogallolacetone resin(*) | 0.45 |
| Polyurethane resin of the invention | 0.30 |
| Cresol-formaldehyde-novolak resin | 0.80 |
| 2-(p-methoxyphenyl)-4,6-bis(trichloromethyl)-s-triazine | 0.02 |
| Oil Blue #603 (manufactured and sold by ORIENT CHEMICAL INDUSTRIES LTD.) | 0.01 |
| Ethylene dichloride | 10 |
| Methyl cellosolve | 10 |

(*)This is disclosed in Example 1 of U.S. Pat. No. 3,635,709.

For comparison, a PS plate (B) was likewise prepared by applying the following light-sensitive liquid (B) to the anodized aluminum plate. The coated amount of the liquid was 2.5 g/$m^2$ (dry basis).

| Composition of the Light-sensitive Liquid (B) | |
|---|---|
| Component | Amount (g) |
| Esterified product of naphthoquinone-1,2-diazido-5-sulfonyl chloride and pyrogallol-acetone resin(*) | 0.45 |
| Cresol-formaldehyde-novolak resin | 1.10 |
| 2-(p-methoxyphenyl)-4,6-bis(trichloromethyl)-s-triazine | 0.02 |
| Oil Blue #603 (manufactured and sold by ORIENT CHEMICAL INDUSTRIES LTD.) | 0.01 |
| Ethylene dichloride | 10 |
| Methyl cellosolve | 10 |

(*)This is disclosed in Example 1 of U.S. Pat. No. 3,635,709.

A positive transparency carrying line images and half-tone images thereon was superposed on each of the PS plates (A)-1 to (A)-5 and (B) and was exposed to light from a carbon arc lamp of 30 A at a distance of 70 cm.

The PS plates (A)-1 to (A)-5 and (B) were immersed in an aqueous solution of DP-4 (manufactured and sold by Fuji Photo Film Co., Ltd.; dilution=8) at 25° C. for 60 seconds to develop the plates.

The resultant lithographic printing plates were set up on KOR type printing machine manufactured and sold by Hiderberg Co., Ltd., then printing was carried out on wood-free paper using an ink commercially available and the final number of printed matter was determined. The results obtained are summarized in Table II.

TABLE II

| PS plate | Polymer used | Number of printed matter |
|---|---|---|
| (A)-1 | Polyurethane (a) | 65,000 |
| (A)-2 | Polyurethane (f) | 70,000 |
| (A)-3 | Polyurethane (i) | 75,000 |
| (A)-4 | Polyurethane (j) | 65,000 |
| (A)-5 | Polyurethane (l) | 75,000 |
| (B)* | Polymer of Comparative Example | 55,000 |

*Comparative Example

As seen from the results listed in Table II, it was found that the lithographic printing plates produced from the PS plates (A)-1 to (A)-5 in which the light-sensitive composition of the present invention is used makes it possible to provide a large number of printed matter compared with that of the comparative one (lithographic printing plate (B)). This means that the composition of the present invention permits the improvement in printing durability of the resultant products such as PS plates or more specifically lithographic printing plates.

What is claimed is:

1. A light-sensitive composition comprising at least one polyurethane resin having at least one repeating unit represented by at least one of formula (I) and formula (II) and which is insoluble in water and soluble in an aqueous alkaline solution; and at least one positive-working light-sensitive o-quinonediazide compound:

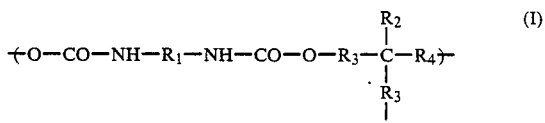

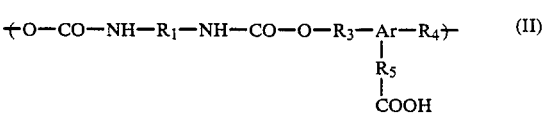

in the above general formula, $R_1$ represents a bivalent aliphatic or aromatic hydrocarbon group which may have a substituent; $R_2$ represents a hydrogen atom or an alkyl, an aralkyl, an aryl, an alkoxy or an aryloxy group which may be substituted with a substituent; $R_3$, $R_4$ and $R_5$ may be the same or different and represent a single bond or a bivalent aliphatic or aromatic hydrocarbon group which may be substituted with a substituent; and Ar represents a trivalent aromatic hydrocarbon group which may be substituted with a substituent, wherein the amount of the o-quinonediazide compound is in the range of from 10 to 50% by weight of the composition.

the amount of the polyurethane resin in the light-sensitive composition falls within the range of from about 5 to 90% by weight of the composition.

the polyurethane resin has an acid value of 1.5 to 4.0 meq/g, and the polyurethane resin and the o-quinonediazide compound are together in admixture.

2. A light-sensitive composition of claim 1 wherein the polyurethane resin is selected from the group consisting of those having, as a base skeleton, the reaction product of a diisocyanate compound of the following general formula (III) with a diol compound having carboxyl groups and represented by the general formula (IV) or (V):

$$OCN-R_1-NCO \qquad (III)$$

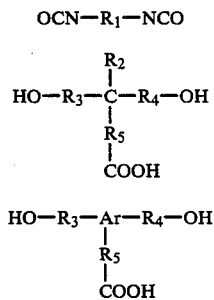

$$HO-R_3-Ar-R_4-OH \atop \underset{COOH}{\overset{|}{R_5}} \qquad (V)$$

wherein $R_1$ represents a bivalent aliphatic or aromatic hydrocarbon group which may be substituted with an alkyl, an aralkyl, an aryl, an alkoxy or a halogen atom with the proviso that $R_1$ may have an ester, an urethane, an amido or an ureido group as another functional group which does not undergo reaction with isocyanate groups; $R_2$ represents hydrogen atom, or an alkyl, an aralkyl, an aryl, an alkoxy or an aryloxy group which may be substituted with cyano, nitro, a halogen atom, $-CONH_2$, $-COOR_6$, $-OR_6$, $-NHCONHR_6$, $-NHCOOR_6$, $-NHCOR_6$, $-OCONHR_6$, $-CONHR_6$ (wherein $R_6$ represents an alkyl group having 1 to 10 carbon atoms or an aralkyl group having 7 to 15 carbon atoms; $R_3$, $R_4$ and $R_5$ may be the same or different and independently represent a single bond, or a bivalent aliphatic or aromatic hydrocarbon group which may be substituted with an alkyl, an aralkyl, an aryl, an alkoxy group or a halogen atom with the proviso that $R_3$, $R_4$ and $R_5$ may have an ester, an urethane, an amido, an ureido or an ether group as another functional group which does not react with isocyanate groups and that at least two of $R_3$, $R_4$ and $R_5$ may form a ring together; Ar represents a trivalent aromatic hydrocarbon group which may have a substituent.

3. A light-sensitive composition of claim 2 wherein the polyurethane resin is selected from the group consisting of those having, as a base skeleton, the reaction product of a diisocyanate compound of the general formula (III) with a diol compound of the general formula (IV) or (V) in which R has the same meanings as defined above, $R_2$ represents hydrogen atom, an alkyl group having 1 to 8 carbon atoms or an aryl group having 6 to 15 carbon atoms, $R_3$, $R_4$ and $R_5$ represent an alkylene group having 1 to 20 carbon atoms or an arylene group having 6 to 15 carbon atoms and Ar represents a trivalent aromatic group having 6 to 15 carbon atoms.

4. A light-sensitive composition of claim 2 wherein the diisocyanate compound is selected from the group consisting of 2,4-tolyenediisocyanate, dimer of 2,4-tolylenediisocyanate, 2,6-tolylenediisocyanate, p-xylylenediisocyanate, m-xylylenediisocyanate, 4,4'-diphenylmethanediisocyanate, 1,5-naphthylenediisocyanate, 3,3'-dimethylbiphenyl-4,4'-diisocyanate, hexamethylenediisocyanate, trimethylhexamethylenediisocyanate, lysin diisocyanate and diisocyanates of dimeric acids, isophorone diisocyanate, 4,4'-methylene-bis(cyclohexylisocyanate), methylcyclohexane-2,4(or 2,6)-diisocyanate, 1,3-(isocyanatemethyl)-cyclohexane; and an adduct obtained from 1 mole of 1,3-butylene glycol and 2 mole of tolylenediisocyanate; and the diol compound is selected from the group consisting of 3,5-dihydroxybenzoic acid, 2,2-bis(hydroxymethyl)-propionic acid, 2,2-bis(2-hydroxyethyl)-propionic acid, 2,2-bis(3-hydroxypropyl)-propionic acid, bis(hydroxymethyl)-acetic acid, bis(4-hydroxyphenyl)-acetic acid, 4,4-bis(4-hydroxyphenyl)-pentanoic acid and tartaric acid.

5. A light-sensitive composition of claim 4 wherein the diol compound is used in combination with at least one diol compound, which has no carboxyl group and does not react with isocyanates, selected from the group consisting of ethylene glycol, diethylene glycol, triethylene glycol, tetraethylene glycol, propylene glycol, dipropylene glycol, polyethylene glycol, polypropylene glycol, neo-pentyl glycol, 1,3-butylene glycol, 1,6-hexanediol, 2-butene-1,4-diol, 2,2,4-trimethyl-1,3-pentanediol, 1,4-bis-beta-hydroxyethoxycyclohexane, cyclohexanedimethanol, tricyclodecanedimethanol, hydrogenated bisphenol A, hydrogenated bisphenol F, ethyleneoxide adduct of bisphenol A, propyleneoxide adduct of bisphenol A, ethyleneoxide adduct of bisphenol F, propyleneoxide adduct of bisphenol F, ethyleneoxide adduct of hydrogenated bisphenol A, propyleneoxide adduct of hydrogenated bisphenol A, hydroquinone dihydroxyethyl ether, p-xylylene glycol, dihydroxyethyl sulfone, bis(2-hydroxyethyl)-2,4-tolylenedicarbamate, 2,4-tolylene-bis(2-hydroxyethylcarbamide), bis(2-hydroxyethyl)-m-xylylenedicarbamate and bis(2-hydroxyethyl)-isophthalate.

6. A light-sensitive composition of claim 2 wherein the polyurethane resin is a reaction product of the diisocyanate with the diol in a molar ratio of 0.8:1 to 1.2:1.

7. A light-sensitive composition of claim 1 wherein the weight average molecular weight of the polyurethane resin is not less than 1,000.

8. A light-sensitive composition of claim 7 wherein the weight average molecular weight of the polyurethane resin is in the range of from 5,000 to 100,000.

9. A light-sensitive composition of claim 1 wherein the amount of the polyurethane resin ranges from about 10 to 60% by weight of the composition.

10. A light-sensitive composition of claim 1 wherein the amount thereof falls within the range of from 20 to 40% by weight.

11. A light-sensitive composition of claim 1 wherein it further comprises phenol-formaldehyde resin, cresol-formaldehyde resin, phenolic modified xylene resin, polyhydroxystyrene and halogenated polyhydroxystyrene in an amount of not more than 70% by weight of the total weight of the composition.

12. A light-sensitive composition of claim 1 wherein it further comprises a cyclic acid anhydride for enhancing the sensitivity thereof, an agent or composition for obtaining a visible image immediately after exposure to light, a dye serving as an image-coloring agent or other fillers.

13. A light-sensitive composition of claim 12 wherein the cyclic acid anhydride is at least one member selected from the group consisting of phthalic acid anhydride, tetrahydrophthalic acid anhydride, hexahydrophthalic acid anhydride, 3,6-endoxy-Δ-tetrahydrophthalic acid anhydride, tetrachlorophthalic acid anhydride, maleic anhydride, chloromaleic acid anhydride, alpha-phenylmaleic acid anhydride, succinic anhydride and pyromellitic anhydride and is used in an amount of 1 to 15% by weight of the composition.

14. A light-sensitive composition of claim 12 wherein the agent or composition for obtaining a visible image immediately after exposure to light is a combination of light-sensitive compound capable of generating an acid when exposed to light and an organic dye capable of forming salts therewith.

* * * * *